United States Patent
Uehira et al.

(10) Patent No.: US 6,580,066 B2
(45) Date of Patent: Jun. 17, 2003

(54) MEASUREMENT SIGNAL GENERATING CIRCUIT FOR LINEAR SCALE

(75) Inventors: Takahisa Uehira, Mobara (JP); Toshihiko Kuga, Mobara (JP)

(73) Assignee: Futaba Corporation, Mobara (JP)

( * ) Notice: Subject to any disclaimer, the term of this patent is extended or adjusted under 35 U.S.C. 154(b) by 36 days.

(21) Appl. No.: 09/938,581

(22) Filed: Aug. 27, 2001

(65) Prior Publication Data

US 2002/0030497 A1 Mar. 14, 2002

(30) Foreign Application Priority Data

Sep. 8, 2000 (JP) ........................................ 2000-273154

(51) Int. Cl.$^7$ .............................. H01J 3/14; G01D 5/34; G01B 11/14; G01B 11/02; G01P 3/00
(52) U.S. Cl. .............................. 250/237 G; 250/231.13; 356/619; 702/145; 702/151; 702/163; 702/161
(58) Field of Search ............................. 324/547, 72, 96; 250/231.1, 231.16, 550, 237 G; 702/124, 145, 151, 163, 161; 356/619

(56) References Cited

U.S. PATENT DOCUMENTS

| | | | | |
|---|---|---|---|---|
| 4,049,965 A | * | 9/1977 | Pettigrew | 250/237 G |
| 4,461,083 A | * | 7/1984 | Ernst | 33/707 |
| 4,491,928 A | * | 1/1985 | Reichl | 702/161 |
| 4,606,642 A | * | 8/1986 | Nelle | 356/619 |
| 4,731,580 A | * | 3/1988 | Indo | 324/207.2 |
| 4,912,322 A | * | 3/1990 | Ichikawa | 250/237 G |
| 5,644,514 A | * | 7/1997 | Abo et al. | 702/124 |
| 6,229,140 B1 | * | 5/2001 | Ishizuka | 250/237 G |
| 6,285,023 B1 | | 9/2001 | Uehira | 250/231.1 |

* cited by examiner

*Primary Examiner*—N. Le
*Assistant Examiner*—Wasseem H. Hamdan
(74) *Attorney, Agent, or Firm*—Oblon, Spivak, McClelland, Maier & Neustadt, P.C.

(57) ABSTRACT

A measurement signal generating circuit for a linear scale capable of increasing an Signal-to-Noise (S/N) ratio, wherein S stands for Corona signal strength, and N for noise strength ratio of a signal for measurement of a linear scale. A photo detector or a low-pass filter for removing noise entering the measurement signal generating circuit is arranged rearwardly of each of an A phase signal generating circuit and a B phase signal generating circuit. Such construction permits a noise component at a different phase as well as that at the same phase to be effectively removed during synthesis of the measurement signal, to thereby reduce an error in measuring by the linear scale.

4 Claims, 7 Drawing Sheets

POSITION OF MOIRE FRINGES AND
PHOTOELECTRIC CONVERSION ELEMENT

PHASE RELATIONSHIP BETWEEN
A PHASE AND B PHASE

MEASUREMENT SIGNAL GENERATING CIRCUIT FOR LINEAR SCALE

BACKGROUND OF THE INVENTION

This invention relates to a measurement signal generating circuit for a linear scale which is adapted to measure relative movement between two objects, and more particularly to a signal processing circuit which is useful to increase an S/N ratio of a Lissajous signal outputted from a photoelectric conversion means.

In a machine tool or the like, accurate measurement of relative movement between a tool and a workpiece is highly important for carrying out precise processing of the workpiece. For this purpose, a variety of measuring devices have been manufactured as commercial products.

One of such measuring devices is practiced in the form of an optical scale utilizing Moire fringes obtained by superposing two optical gratings on each other. The optical scale is generally constructed in such a manner as shown in FIGS. 5(a) and 5(b). More particularly, the optical scale includes a main scale 101 including a transparent glass scale 100 which is formed thereon with gratings (cut lines) so that light-permeable sections and light-impermeable sections are arranged at predetermined pitches. The optical scale also includes an index scale 103 including a transparent glass scale 102 formed thereon with gratings so that light-permeable sections and light-impermeable sections are arranged at predetermined pitches. The main scale 101 and index scale 103, as shown in FIG. 5(a), are arranged opposite to each other at a microinterval. Also, the main scale 101 and index scale 103, as shown in FIG. 5(b), are so arranged that the gratings of the index scale 103 are inclined at a microangle with respect to the gratings of the main scale 101.

The gratings provided on the main scale 101 and index scale 103 are formed at the same pitches by forming chromium on the glass scales 100 and 102 by vacuum deposition and then subjecting it to etching.

Such arrangement of the gratings permits generation of Moire fringes shown in FIG. 6. The Moire fringes are formed at intervals W, so that dark portions or bright portions are obtained at the intervals W. The dark portions or bright portions are downwardly or upwardly moved depending on a direction in which the index scale 103 is laterally moved relative to the main scale 101. In this instance, supposing that pitches of gratings of the main scale 101 and index scale 103 are indicated by P and an inclination angle between both scales 101 and 103 is indicated by θ (rad), the intervals W of the Moire fringes are represented by the following expression:

$$W = P/\theta$$

Thus, the intervals W of the Moire fringes are optically defined to be 1/θ times as large as the grating intervals P. Therefore, when the grating is moved by one pitch P, the Moire fringe is displaced by W, so that movement within the pitch P may be precisely measured by reading a variation in intervals W in a vertical direction.

For example, as shown in FIG. 7, a photoelectric conversion element 110 is provided on the index scale 103 and a light source is provided on a side of the main scale 101 opposite to the photoelectric conversion element 110, so that a variation in current flowing to the photoelectric conversion element 110 may be read while moving the index scale 103 relative to the main scale 101.

More particularly, when a pattern of the Moire fringes is at a state indicated by A in FIG. 7, the amount of light irradiated to the photoelectric conversion element 110 is maximized, so that a current flowing to the photoelectric conversion element 110 reaches a maximum level I1. Then, when the pattern is at a state indicated by B in FIG. 7 due to relative movement between the main scale 101 and the index scale 103, the amount of light irradiated to the photoelectric conversion element 110 is somewhat reduced, so that the current is reduced to a level I2. When the relative movement is further carried out to cause the pattern to be at a state indicated at C, the amount of light irradiated to the photoelectric conversion element 110 is minimized, so that the current is reduced to a minimum level I3. Then, when the index scale 103 is further moved relative to the main scale 101 to cause the pattern to be at a state D in FIG. 7, light irradiated to the photoelectric conversion element 110 is somewhat increased, resulting in the current being increased to a level I2. Moreover, the relative movement is further carried out to cause the pattern to be at a state E in FIG. 7, light irradiated to the photoelectric conversion element 110 is increased to the maximum level again, so that the current may be increased to the maximum level I1.

Thus, the current flowing to the photoelectric conversion element 110 is varied in a manner like a sinusoidal wave, and when the variation elapses by one period, relative movement between the main scale 101 and the index scale 103 is carried out by the grating interval P.

In FIG. 7, only one such photoelectric conversion element 110 is arranged. Alternatively, as shown in FIG. 8, an A phase photoelectric conversion element 111 and a B phase photoelectric conversion element 112 may be arranged while being deviated from each other by one period (interval W) and 90°. Such arrangement permits a current flowing to the B phase photoelectric conversion element 112 to be deviated by 90° with respect to a current flowing to the A phase photoelectric conversion element 111, as shown in FIG. 9. Thus, supposing that a current flowing to the A phase photoelectric conversion element 111 is in the form of a sinusoidal wave, that flowing to the B phase photoelectric conversion element 112 is in the form of cosine wave.

In this instance, a phase of the current flowing to the B phase photoelectric conversion element 112 is advanced or delayed by 90° relative to that of the current flowing to the A phase photoelectric conversion element 111 depending on a direction of relative movement between the main scale 101 and the index scale 103. Thus, when the two photoelectric conversion elements 111 and 112 are arranged while being deviated by 90° relative to each other, a phase therebetween may be detected, resulting in a direction of the relative movement being detected.

Actually, the conventional optical scale is so constructed that any additional photoelectric conversion element is arranged at a predetermined position, to thereby concurrently output an A phase signal and a B phase signal, as well as inverted A phase and B phase signals respectively obtained by inverting the A phase and B phase signals by 180°. Such construction permits a DC component to be removed from the signal detected and ensures reliability of the signal and follow-up characteristics at a high speed.

FIG. 4(a) indicates the above-described A phase signal and inverted A phase signal and the above-described B phase signal and inverted B phase signal obtained by arranging four photo-detectors at predetermined positions on the index scale.

Also, FIG. 4(b) shows a circuit for forming a synthesized A-phase signal based on waveforms of the two A phase signals described above, wherein AP and −AP each indicate a photo detector for detecting Moire fringes formed by light permeating between the cut lines of the scale to convert them into an electric signal.

In a sinusoidal current of an inverted phase outputted from each of the photo detectors, one of signals thereof is inverted at a phase thereof through an inversion amplifier A1 and synthesized in an addition circuit ADD constituted by an operational amplifier OP.

Synthesis of the B phase signal is likewise carried out in such a circuit as described above.

Such a circuit structure permits synthesis of a measurement signal from which a DC signal is removed through the single operational amplifier OP, to thereby accomplish a reduction in manufacturing cost. However, it renders adjustment in offset before the synthesis difficult, leading to a deterioration in balance between the A phase signal (B phase signal) and the −A phase signal (−B phase signal).

In view of the above, the conventional optical scale device, as shown in FIG. 4(c), is so constructed that signals outputted from the photo detectors AP and −AP are amplified through current/voltage converters A1 and A3, resulting in individually having a predetermined voltage level. Then, the outputs are numerically added to each other by a differential amplifier OP1, to thereby provide the A phase signal.

Such an approach ensures balance between the A phase signal and the −A phase signal, to thereby prevent generation of strain in a waveform of the A phase signal for measurement synthesized, even when the scale is moved at a high speed.

The conventional optical scale thus constructed is arranged on an NC machine tool to measure relative movement between a tool and a workpiece. In general, the photo detector having the scale mounted thereon to detect the signal is arranged on a side of the machine tool, whereas a signal processing means which carries out processing of the sinusoidal Lissajous signal detected, to thereby display the actual measurement signal is arranged at a different position while being connected to a signal transmission cable.

Also, a linear scale is generally used in a place in which a machine tool or the like is arranged, so that noise generated in the place may be readily picked up by the linear scale, resulting in the noise component being included in a waveform of the signal detected.

When the signal having the noise component included therein is processed to operate a highly accurate measured value of which a phase is divided, a display section of the device indicates a wrong numerical value. Thus, when the linear scale outputs a relative measured value, the device fails to readily correct the error.

In particular, the photo detectors for detecting the four signals constituted by the A phase signal, −A phase signal, B phase signal and −B phase signal are arranged on a support member at predetermined intervals. However, the support member resonates at a natural frequency, to thereby cause a high oscillation frequency to be generated irrespective of each signal phase, when the scale is moved at a high speed or load is applied to the machine tool. When the thus-generated oscillation frequency is introduced as noise into a signal processing circuit, it forms noise at a different phase, which cannot be fully removed even by a signal generating circuit of the differential amplification type which is effective for noise at the same phase.

SUMMARY OF THE INVENTION

The present invention has been made in view of the foregoing disadvantage of the prior art.

Accordingly, it is an object of the present invention to provide a measurement signal generating circuit for a linear scale which is capable of reducing an error in measurement by the linear scale.

It is another object of the present invention to provide a measurement signal generating circuit for a linear scale which is capable of effectively removing noise at a different phase as well as that at the same phase.

In accordance with the present invention, a measurement signal generating circuit for a linear scale is provided. The measurement signal generating circuit includes a scale having graduations provided thereon at equal intervals in a direction of movement thereof, a detection means for detecting relative movement of the scale as four measurement signals constituted by a sinusoidal A phase signal, a −A phase signal obtained by inverting the A phase signal, a B phase signal of which a phase is shifted by 90 degrees with respect to the A phase signal and a −B phase signal obtained by inverting the B phase signal, amplification circuits each arranged for amplifying each of the four measurement signals to a predetermined level, a differential amplifier for adding antiphase components outputted from the amplification circuits to each other and outputting them therefrom, and a low-pass filter circuit arranged rearwardly of the differential amplifier to remove a high-frequency noise component.

In a preferred embodiment of the present invention, the low-pass filter circuit is constituted by an active filter.

In a preferred embodiment of the present invention, the low-pass filter circuit is so constructed that a cut-off frequency thereof is varied depending on a speed of movement of the scale.

In a preferred embodiment of the present invention, the low-pass filter circuit uses a switched capacitor for a time constant circuit. The switched capacitor is driven by a clock signal corresponding to a speed of movement of the scale.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, a measurement signal generating circuit for a linear scale according to the present invention will be described with reference to the accompanying drawings.

Figure 1:
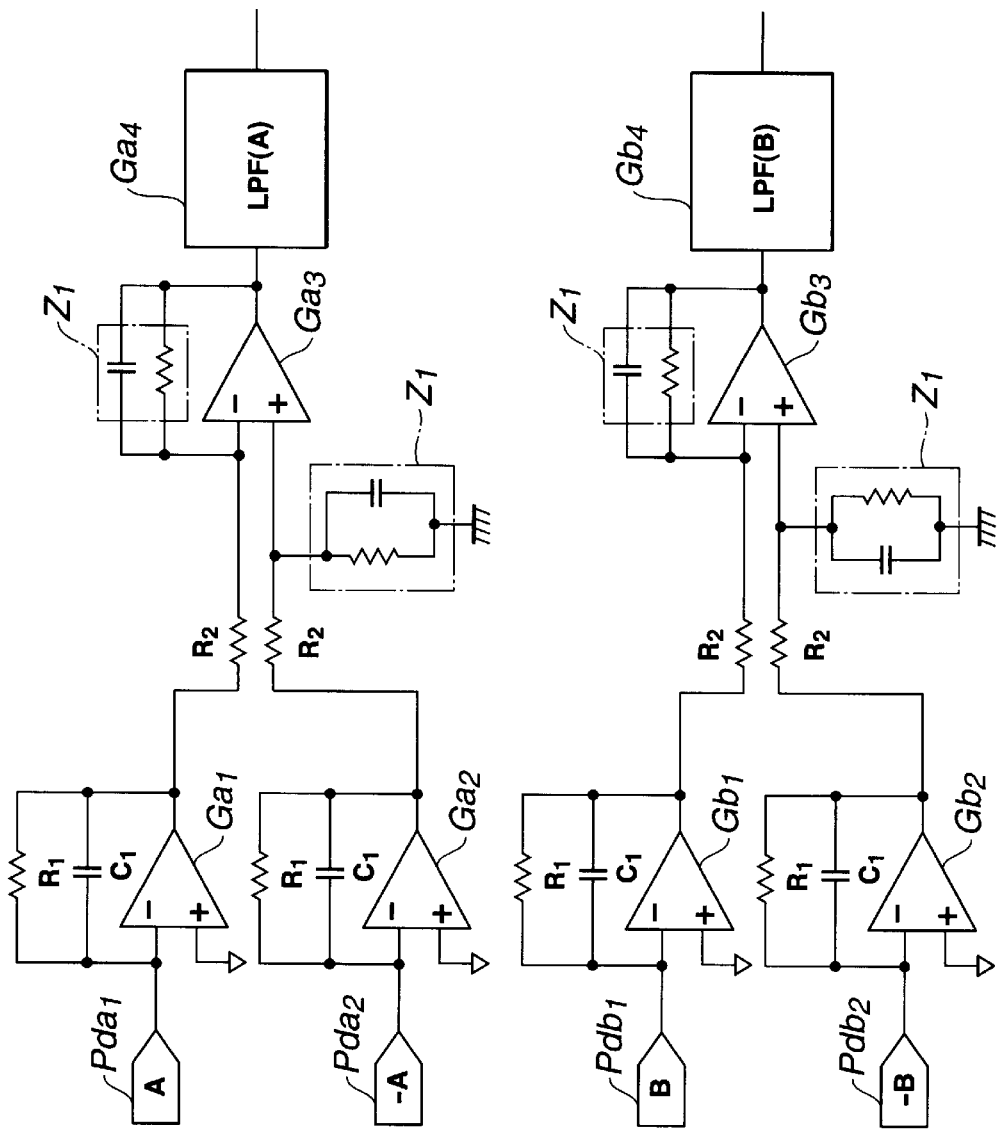
FIG. 1 is a block diagram showing a measurement signal generating circuit for a linear scale according to the present invention.

Referring first to FIG. 1, an essential part of a device for generating a signal for measurement according to the present invention is illustrated. More specifically, it shows a circuit for synthesizing an A phase signal, a −A phase signal, a B phase signal and a −B phase signal respectively outputted from photo detectors Pd1, Pd2, Pd3 and Pd4 to form an A phase signal and a B phase signal for measurement. In FIG. 1, reference character Ga1 designates an amplifier for the A phase signal, Ga2 is an amplifier for the −A phase signal, Gb1 is an amplifier for the B phase signal, and Gb2 is an amplifier for the −B phase signal.

The amplifiers Ga1, Ga2, Gb1 and Gb2 each include a resistor R1 and a capacitor C1 which act as a feedback circuit. Such construction of each of the amplifiers permits the amplifier to function as a high-gain amplifier stabilized.

The amplifiers Ga2 and Gb2 for the −A phase signal and −B phase signal each of which is outputted in the form of an antiphase signal are so adjusted that the resistors R1 each are partially replaced with a variable resistor $\Delta R$ to permit amplitudes of signals synthesized in adders or addition circuits Ga3 and Gb3 arranged rearwardly thereof to be substantially coincident with each other.

Also, the amplifiers Ga2 and Gb2 each are so constructed that an offset voltage is fed thereto through a positive-phase input terminal thereof, resulting in a DC component having the same level.

Thus, the antiphase components of the amplifiers are fed through resistors R2 to the adders Ga3 and Gb3, respectively, so that outputs thereof may be formed with sinusoidal A and B phase signals for measurement from which the DC component is removed.

The adders Ga3 and Gb3 each are provided with a feedback circuit for the purpose of stabilizing a phase of the signal. In the illustrated embodiment, the feedback circuit is constituted by an impedance Z1. Such arrangement of the feedback circuit effectively reduces an unstable element based on a phase at a high frequency.

The detection circuit of the illustrated embodiment includes, in addition to the adders, filters Ga4 and Gb4 which permit a low frequency to pass therethrough (hereinafter referred to also as "low-pass filters (LPF)"). The low-pass filters Ga4 and Gb4 are arranged rearwardly of the adders Ga3 and Gb3, respectively.

The low-pass filters Ga4 and Gb4 each are constructed so as to set a cut-off frequency based on a frequency of a sinusoidal signal outputted from the linear scale at a maximum speed thereof, resulting in a signal of a frequency equal to or higher than the cut-off frequency introduced thereinto being removed as a noise signal therefrom.

A maximum frequency of a signal detected is determined by a pitch P of cut lines formed on the scale and a maximum speed of movement of the scale. For example, supposing that the cut lines are arranged at pitches of 20 $\mu$m and the scale is moved at a speed of 1 m/sec, the maximum frequency is as high as about 50 kHz.

Thus, the cut-off frequency of each of the low-pass filters Ga4 and Gb4 is provided by a circuit having characteristics of damping a signal having a frequency equal to the cut-off frequency or above.

Figure 2A:
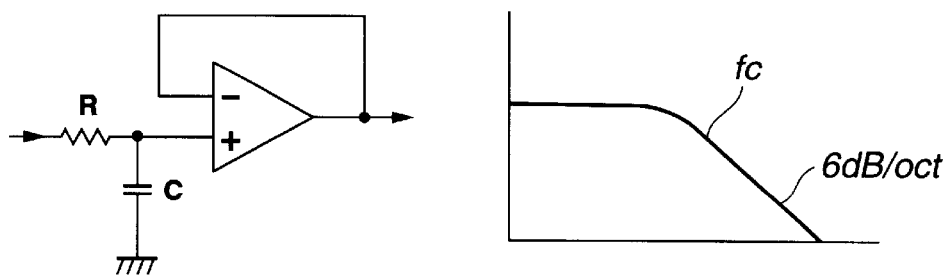
FIGS. 2(a) and 2(b) each are a circuit diagram showing a low-pass filter.

In the most simplified manner, a circuit for the low-pass filter, as shown in FIG. 2(a), may be constructed as a primary low-pass filter wherein an integration circuit constituted by a resistance R and a capacitor C is arranged at an input terminal of an operational amplifier OP.

In this instance, the circuit has damping characteristics of 6 dB/oct and a cut-off frequency thereof damping by −3 dD is set to be ½ $\pi$CR.

Thus, when the amplifier Ga1 combines them with high-frequency damping characteristics of the adder Ga3, tertiary LPF characteristics are obtained.

Figure 2B:
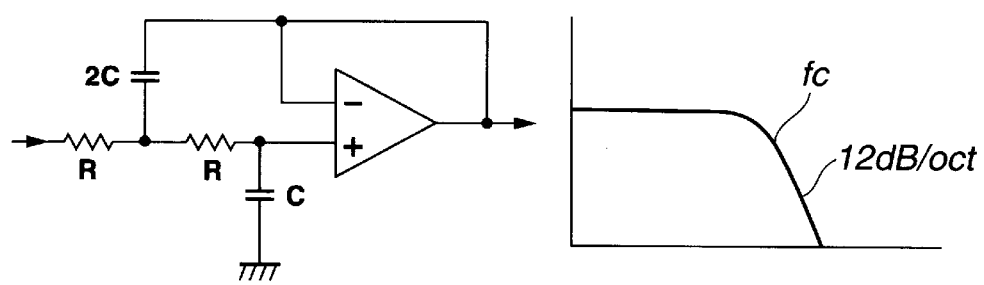

An active filter configured so as to feedback an output of the operational amplifier OP through a capacitor to an input side as shown in FIG. 2(b) is known in the art as a pass filter of the secondary Butterworth type and has damping characteristics of 12 dB/oct.

A cut-off frequency of the filter is set at $\frac{1}{2} \times (2 \pi RC)^{1/2}$. The filter of such a type has flat amplitude characteristics, to thereby prevent generation of ripple within a pass band. However, it has a drawback that a factor related to a phase is relatively increased.

In this regard, a low-pass filter of the Bessel type is known to be relatively constant in phase delay of a signal and exhibit satisfactory waveform reproducibility. Thus, it may be used in the illustrated embodiment.

Figure 3A:
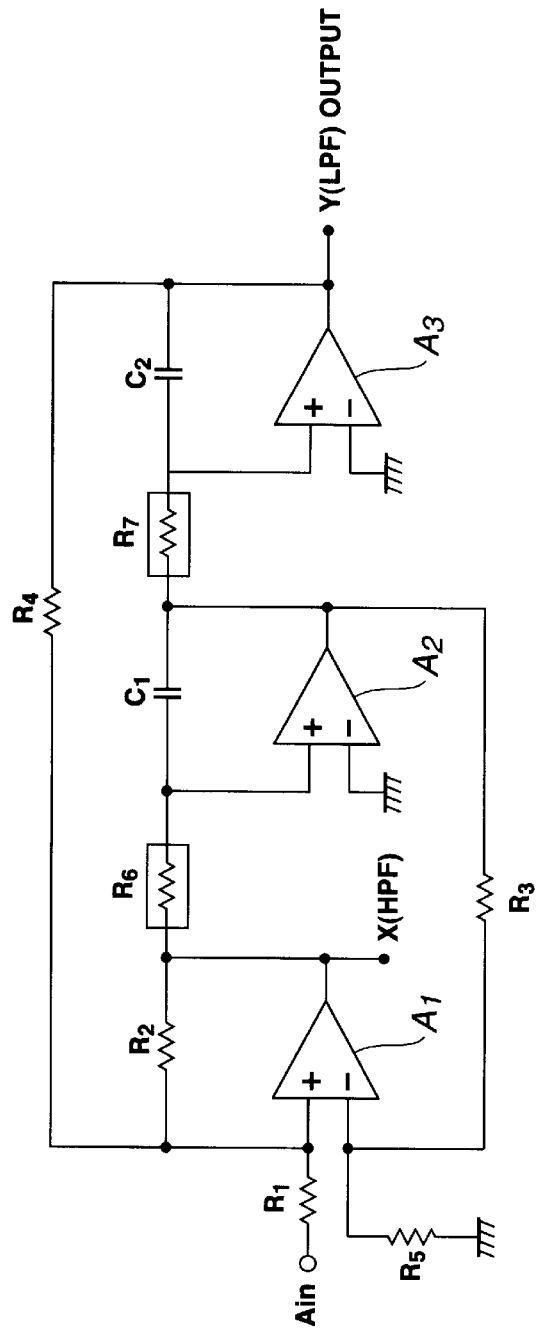
FIGS. 3(a) and 3(b) each are a circuit diagram showing a low pass filter of the state variable type.

FIG. 3(a) shows a filter of the state variable type which has operational amplifiers A1, A2 and A3 incorporated therein. In the filter, the operational amplifiers A1, A2 and A3 function to output signals of various characteristics, respectively. The filter exhibits characteristics of a low-pass filter when an output Y (LPF) of the operational amplifier A3 is used.

More specifically, a cut-off frequency $\Omega c$ of the filter is $(R2/R3R6Rr7C1C2)^{1/2}$ ($\Omega c=(R2/R3R6Rr7C1C2)^{1/2}$) and a total gain G thereof is R3/R1 (G=R3/R1).

Thus, the cut-off frequency is set depending on a value of each impedance element. In this instance, when resistors R6 and R7 are rendered variable at the same rate, only the cut-off frequency is permitted to be independently variable.

In view of such an advantage, when a switched capacitor is used as each of the resistors R6 and R7 and a resistance of the switched capacitance is controlled by a clock frequency, the cut-off frequency is permitted to be varied depending on a speed of movement of the linear scale, resulting in a noise component being efficiently removed.

Figure 3B:
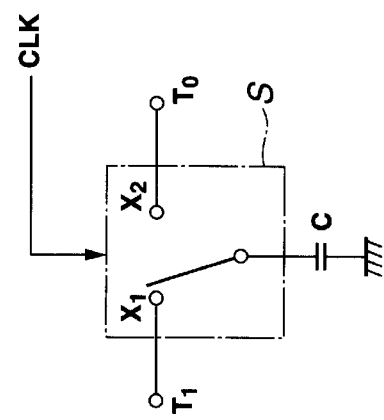
Figure 3B:
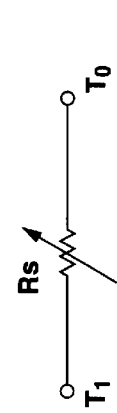
Figure 4A:
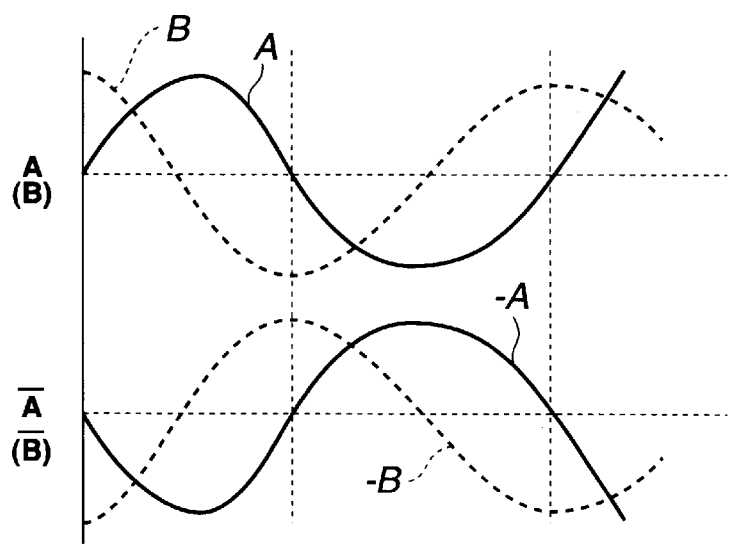
FIGS. 4(a) to 4(c) each are a view showing a principle of a circuit for generating a signal for measurement.
Figure 4B:
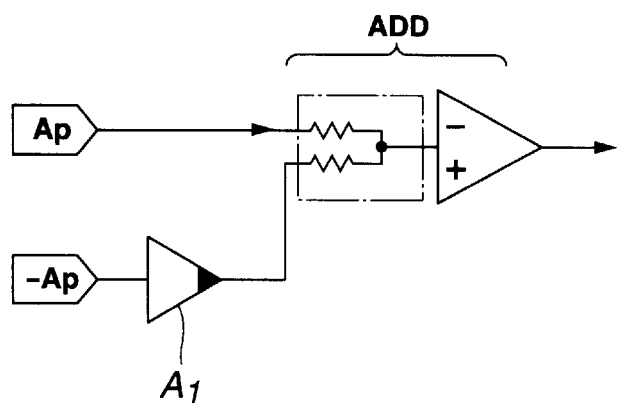
Figure 4C:
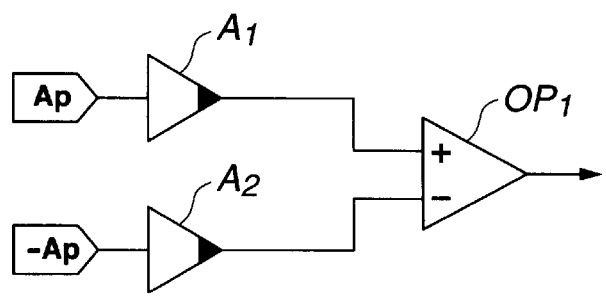
Figure 5A:
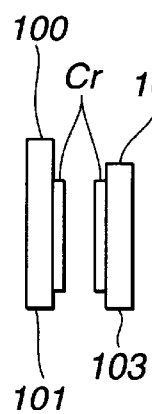
FIGS. 5(a) and 5(b) each are a schematic view showing an optical scale.
Figure 5B:
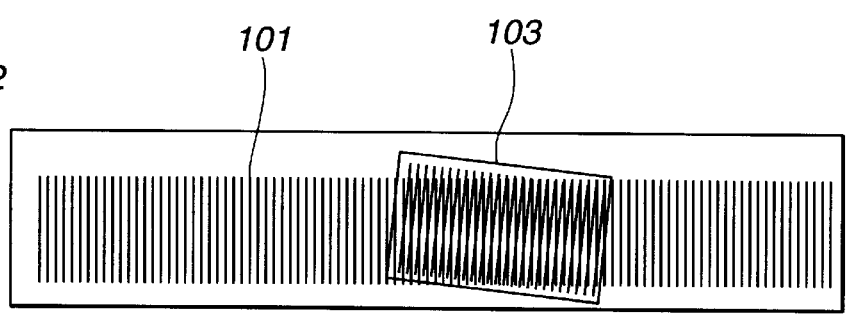
Figure 6:
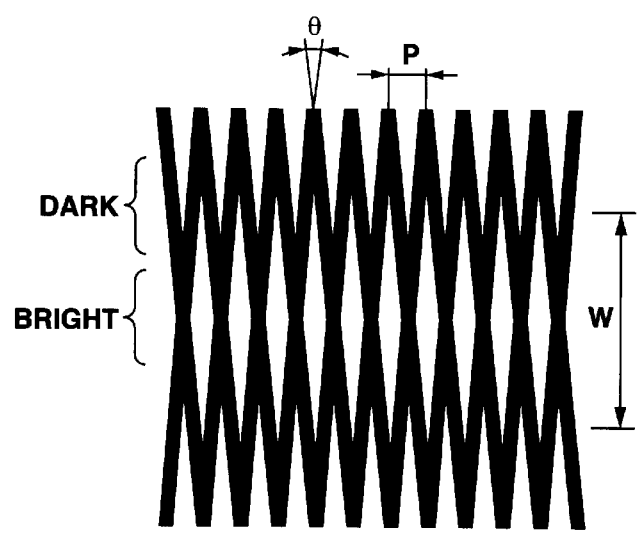
FIG. 6 is a schematic view showing Moire fringes.
Figure 7:
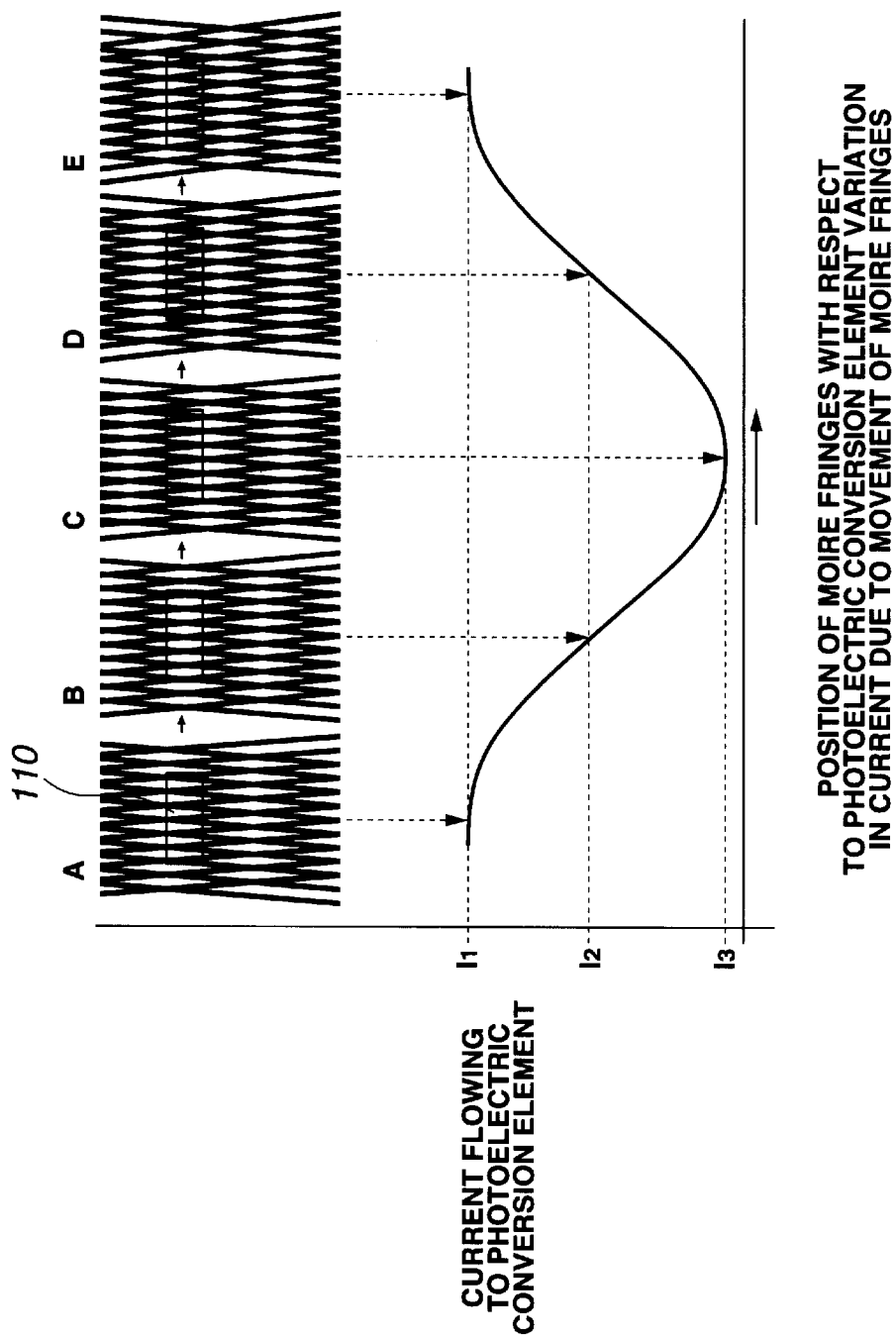
FIG. 7 is a diagrammatic view showing movement of Moire fringes.
Figure 8:
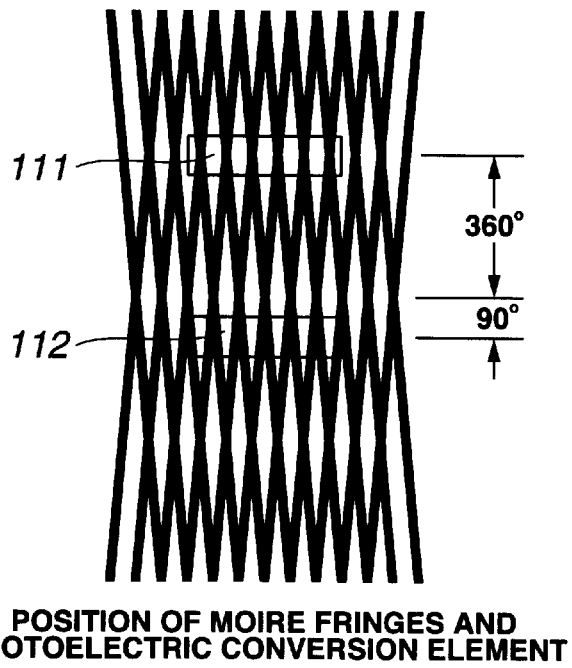
FIG. 8 is a diagrammatic view showing a position at which photoelectric conversion elements are arranged.
Figure 9:
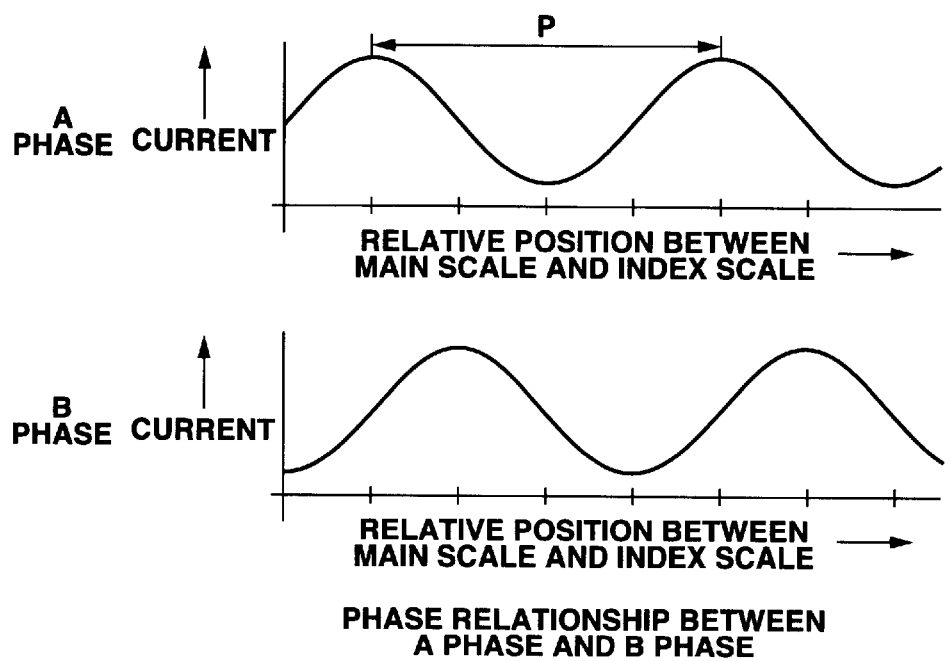
FIG. 9 is a diagrammatic view showing waveforms of A and B phase signals.

The switched capacitor, as shown in FIG. 3(b), is constituted by a capacitor C and a switch S. The switch S includes contacts x1 and x2. When the contacts x1 and x2 are changed over by a clock frequency f, a resistance Rs acting as an equivalent resistance is f·1/C (Rs=f·1/C).

Thus, when the illustrated embodiment is constructed in such a manner that a clock signal is formed in correspondence to a speed of movement of the scale or a period of a sinusoidal signal measured and the switched capacitor is driven, LPF characteristics which permit the cut-off frequency to be increased during movement of the scale at a high speed and reduced during the movement at a low speed may be obtained, so that the illustrated embodiment may exhibit a function of removing noise during the movement at a low speed as well.

As can be seen from the foregoing, the present invention is so constructed that the photo detector or the low-pass filter for removing noise entering the measurement signal generating circuit is arranged rearwardly of each of the A phase signal generating circuit and B phase signal generating circuit. Such construction permits a noise component at a different phase as well as that at the same phase to be effectively removed during the synthesis, to thereby reduce an error in measuring by the linear scale.

While a preferred embodiment of the invention has been described with a certain degree of particularity with reference to the drawings, obvious modifications and variations are possible in light of the above-teachings. It is therefore to be understood that within the scope of the appended claims, the invention may be practiced otherwise than as specifically described.

What is claimed is:

1. A measurement signal generating circuit for a linear scale, comprising:
   a scale having graduations provided thereon at equal intervals in a direction of movement thereof;
   a detection means for detecting relative movement of said scale as four measurement signals constituted by a sinusoidal A phase signal, a −A phase signal obtained by inverting said A phase signal, a B phase signal of which a phase is shifted by 90 degrees with respect to said A phase signal and a −B phase signal obtained by inverting said B phase signal;
   amplification circuits each arranged for amplifying each of said four measurement signals to a predetermined level;
   a differential amplifier for adding antiphase components outputted from said amplification circuits to each other and outputting them therefrom; and
   a low-pass filter circuit arranged rearwardly of said differential amplifier to remove a high-frequency noise component.

2. A measurement signal generating circuit as defined in claim 1, wherein said low-pass filter circuit is constituted by an active filter.

3. A measurement signal generating circuit as defined in claim 1, wherein said low-pass filter circuit is so constructed that a cut-off frequency thereof is varied depending on a speed of movement of said scale.

4. A measurement signal generating circuit as defined in claim 3, wherein said low-pass filter circuit uses a switched capacitor for a time constant circuit;
   said switched capacitor being driven by a clock signal corresponding to a speed of movement of said scale.

* * * * *